United States Patent
Tran et al.

(10) Patent No.: US 8,072,815 B2
(45) Date of Patent: Dec. 6, 2011

(54) ARRAY OF NON-VOLATILE MEMORY CELLS INCLUDING EMBEDDED LOCAL AND GLOBAL REFERENCE CELLS AND SYSTEM

(75) Inventors: Hieu Van Tran, San Jose, CA (US); Anh Ly, San Jose, CA (US); Hung Q. Nguyen, Fremont, CA (US); Thuan T. Vu, San Jose, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 12/965,504

(22) Filed: Dec. 10, 2010

(65) Prior Publication Data

US 2011/0080790 A1    Apr. 7, 2011

Related U.S. Application Data

(63) Continuation of application No. 12/398,155, filed on Mar. 4, 2009.

(51) Int. Cl.
*G11C 16/06* (2006.01)
(52) U.S. Cl. ............ 365/185.2; 365/185.21; 365/185.23
(58) Field of Classification Search ............... 365/185.2, 365/185.21, 185.11, 185.23, 185.25, 185.27
See application file for complete search history.

(56) References Cited

U.S. PATENT DOCUMENTS

| | | | |
|---|---|---|---|
| 6,416,556 B1 * | 7/2002 | Park | 365/185.28 |
| 6,490,212 B1 | 12/2002 | Nguyen et al. | |
| 7,009,243 B2 | 3/2006 | Ishii et al. | |
| 7,342,832 B2 | 3/2008 | Lee et al. | |
| 7,660,161 B2 | 2/2010 | Van Tran | |
| 7,692,987 B2 | 4/2010 | Edahiro et al. | |
| 2003/0043621 A1 * | 3/2003 | Wong | 365/185.03 |
| 2009/0257298 A1 * | 10/2009 | Kajigaya et al. | 365/207 |
| 2010/0073992 A1 * | 3/2010 | Ueda | 365/148 |
| 2010/0226181 A1 * | 9/2010 | Tran et al. | 365/185.21 |

* cited by examiner

*Primary Examiner* — Richard Elms
*Assistant Examiner* — Hien Nguyen
(74) *Attorney, Agent, or Firm* — DLA Piper LLP (US)

(57) ABSTRACT

An array of memory cells has a first side adjacent to a first column, a second side opposite the first side, a third side adjacent to a first row, and a fourth side opposite the third side. Each memory cell is connected to a bit line, a high voltage source, and a low voltage source. Reference cells, substantially the same as the memory cells, evenly spaced apart, are embedded in the array. A high voltage decoder is on the first side, connected to the memory cells and reference cells in the same row. A low voltage row decoder is on the second side, connected to the memory cells and reference cells in the same row. Sense amplifiers are on the third side, connected to the memory cells and to the reference cells.

9 Claims, 9 Drawing Sheets

US 8,072,815 B2

ARRAY OF NON-VOLATILE MEMORY CELLS INCLUDING EMBEDDED LOCAL AND GLOBAL REFERENCE CELLS AND SYSTEM

This application is a continuation of U.S. patent application Ser. No. 12/398,155 filed on Mar. 4, 2009.

TECHNICAL FIELD

The present invention relates to an array of non-volatile memory cells including reference cells. In one embodiment, the reference cells are embedded in the array of memory cells. In another embodiment, the reference cells are position immediately outside of the array of memory cells but immediately adjacent thereto, and accessible by the same decoder circuits as the decoder circuits for the array of memory cells.

BACKGROUND OF THE INVENTION

Non-volatile memories and memory devices are well known in the art. Referring to FIG. 1 there is shown a schematic block level diagram of a memory device 10 of the prior art. The device 10 comprises well known components such as an address controller 12 for receiving address signals from an address bus 14. The address signals are supplied to an X decoder 16, also commonly known as a row or word line decoder 16. The X decoder 16 receives the address signals and decodes them to produce decoded row signals which are supplied onto row lines, which are connected to the memory array 20. The memory way 20 comprises an array of volatile memory cells arranged in a plurality of rows and columns. A reference control circuit 18 is connected to an array of reference non-volatile memory cells 21 and also controls the access of the array 21. The array of reference non-volatile memory cells 21 also comprise an array of reference memory cells arranged in a plurality of rows and columns. In the preferred embodiment, the reference memory cells in the array 21 of reference cells are the same type of non-volatile memory cells as those in the array 20 of memory cells. The array 21 is typically is outside of the main array 20 and is isolated from it physically. In addition, as is well known, a Y decoder 30, also for decoding, an address signal is positioned in the column direction and is used to control both the memory array 20 and the reference gray 21 (i.e. the Y decoder 30 includes a Y decoder for the main array 20 and a reference Y decoder for the reference array 21). From the output of the Y decoder 30, the column signals or sensed bit signals are supplied to a sense amplifier 32. As is well known, the sense amplifier 32 receives a signal from a selected memory cell from the memory array 20 and a signal from a selected reference cell from the reference array 21, and compares the two to determine the state of storage of the selected memory cell. Other well known components of the memory device 10 include an I/O buffer and controller 34 to receive the output signal from the sense amplifier 32. The memory device 10 further includes a logic controller 40, as well as other circuits necessary for the operation of the memory device 10, such as high voltage generation circuit 42 and a testing circuit 44.

There are a number of drawbacks of the memory device 10 shown in FIG. 1. Since the reference cells are separate from that of regular data cells, the reference cells do not track for example the affect of the process details of the data cells. Also the reference cells do not track the array environment of the data cells.

Accordingly, there is a need for a memory device having its memory cells and reference cells more integrated.

SUMMARY OF THE INVENTION

Accordingly, in the present invention, a non-volatile memory device comprises an array of non-volatile memory cells arranged in a plurality of rows and columns. Each memory cell has a bit terminal for connection to a bit line, a high voltage terminal for connection to a high voltage source, and a low voltage terminal for connection to a low voltage source. The array has a first side adjacent to a first column of memory cells, and a second side opposite the first side, a third side adjacent to a first row of memory cells, and a fourth side opposite the third side. The memory device further comprises a plurality of columns of reference memory cells embedded in the memory array, with a plurality of reference cells in each row of the array of non-volatile memory cells, substantially evenly spaced apart from one another. Each of the reference memory cells is substantially the same as the non-volatile memory cells, and has a bit terminal for connection to a bit line, a high voltage terminal for connection to a high voltage source and a low voltage terminal for connection to a low voltage source. A high voltage decoder is positioned on the first side, and has a plurality of high voltage lines, with each high voltage line connected to the high voltage terminal of the memory cells and reference cells in the same row. A low voltage row decoder is positioned on the second side, and has a plurality of low voltage lines, with each low voltage line connected to the low voltage terminal of the memory cells and reference cells in the same row. A plurality of sense amplifiers are positioned on the third side, with each sense amplifier connected to the bit terminal of one column of non-volatile memory cells and to the bit terminal of a column of reference memory cells.

DETAILED DESCRIPTION OF THE PREFERRED EMBODIMENT

Figure 2:
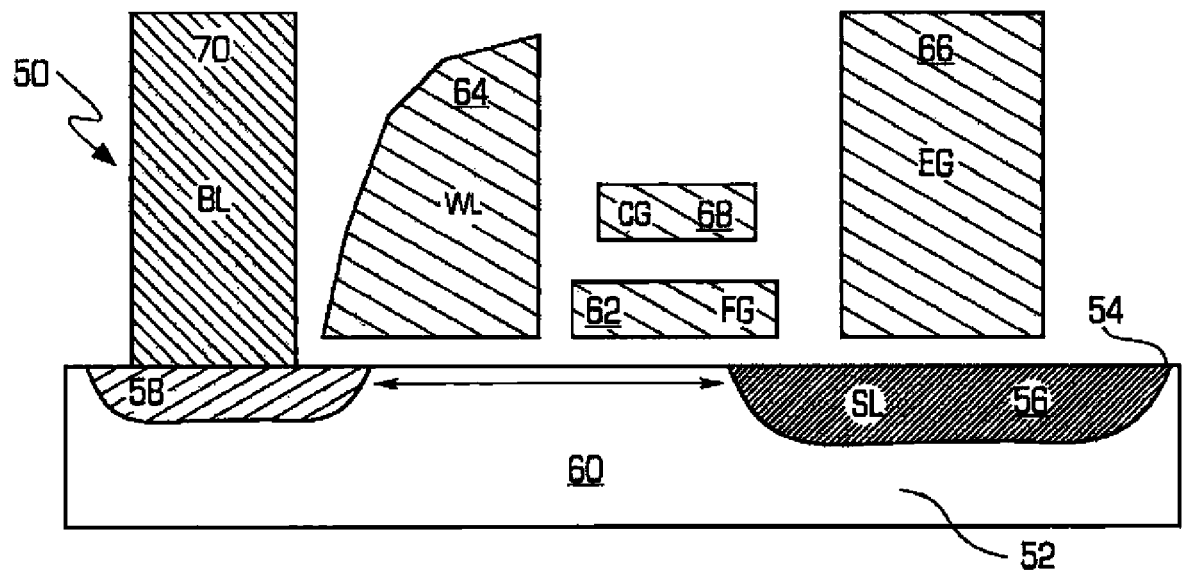
FIG. 2 is a cross sectional view of a non-volatile memory cell of the prior art, suitable for use in the memory device of the present invention.

Referring to FIG. 2 there is shown a cross sectional view of a well known memory cell 50 that can be used in the memory device 100 of the present invention, although as will be discussed hereinafter the memory device 100 of the present invention may be used with any non-volatile memory cell, and is not limited to the memory cell 50 shown in FIG. 2. The memory cell 50 comprises a silicon substrate 52 of a first conductivity type, such as P type. The substrate 52 has a planar surface 54. Within the substrate 52 and near the surface 54 is a first region 56 (also known as source region or source line SL) of a second conductivity type, such as N conductivity type. A second region 58 (also known as drain region or bitline BL) of the second conductivity type is spaced apart from the first region 56, thereby forming a channel region 60 between the first region 56 and the second region 58. A floating gate FG 62 is positioned over a portion of the channel region 60 and is insulated therefrom. A word line WL (also known as select gate SG) 64 is positioned adjacent to one side of the floating gate 62, insulated therefrom and is over another portion of the channel region 60 and is also insulated from the channel region 60. An erase gate EG 66 is positioned adjacent to another side of the floating gate 62, insulated therefrom and is over the first region 56 and is insulated therefrom. A top gate CG (control gate or coupling gate) 68 is positioned over the floating gate 62 and is insulated therefrom, and is between the select gate 64 and the erase gate 66. Finally, a bit line 70 is connected to the second region 58.

In the operation of the memory cell 50, for erase, a high voltage is applied to the erase gate 66. The top gate 68 is supplied with ground voltage or alternatively negative voltage, while all of the other terminals (i.e. second region 58, select gate 64, and first region 56) are grounded. Alternatively region 58 can be left floating. The high positive voltage applied to the erase gate 66 attract the electrons from the floating gate 62, and the electrons tunnel through the insulator separating the floating gate 62 and the erase gate 66.

To program the memory cell 50, the following voltages are applied. A bias current is applied to the second region 58. Or alternatively a low voltage or ground is applied to the second region 58. A low voltage sufficient to turn on the portion of the channel region 60 underneath the select gate 64 is applied to the select gate 64. A high voltage is applied to the first region 56. A high voltage is applied to the top gate 68. A high voltage is applied to the erase gate 66. The high voltage from the control gate 68, the first region 56, the erase gate 66 capacitively couples to the floating gate 62 to enable the transfer of the high voltage from the first region 56 into the channel 60 to a channel gap region underneath the gap between the select gate 64 and the floating gate 62. This high voltage causes a high field region across the channel gap to attract electrons from the second region 58. Hence electrically, electrons from the second region are attracted to the first region 56 in the channel region 60. When they reach the gap region junction in the channel region 60 between the select gate 64 and the floating gate 62, they experience a high voltage attraction to the floating gate caused by the high voltage applied to the top gate 68 which is capacitively coupled to the floating gate 62. The electrons then jump across the insulator and are injected into the floating gate 62.

Finally, to read the memory cell 50, the following voltages are applied. A positive voltage is applied to the second region 58 through the bitline 70. A ground voltage is applied to the first region 56. A positive voltage is applied to the select gate 64, sufficient to turn on the portion of the channel region 60 over which the select gate 64 is positioned. Finally, a positive voltage is applied to the top gate 68. In the event the memory cell 50 is erased and not programmed yet, a current will flow from the second region 58 to the first region 56. However, if the memory cell 50 is programmed, i.e. electrons are stored on the floating gate 62, the positive voltage on the top gate 68 is insufficient to turn on the channel region 60 or turns on the channel region 60 very weakly. The difference in the current flow between the programmed state (electrons stored on the floating gate 62) and erased state (no electrons stored on the floating gate 62) can be detected as a '0' or '1' logical data state respectively.

Thus, with the memory cell 50, certain of the terminals such as second region 58 and select gate 64 will always receive either a low voltage, or ground, or is floating, and certain of the terminals such as erase gate 66 will receive a high voltage, or ground or floating, while other terminals can receive both low and high voltages.

Figure 1:
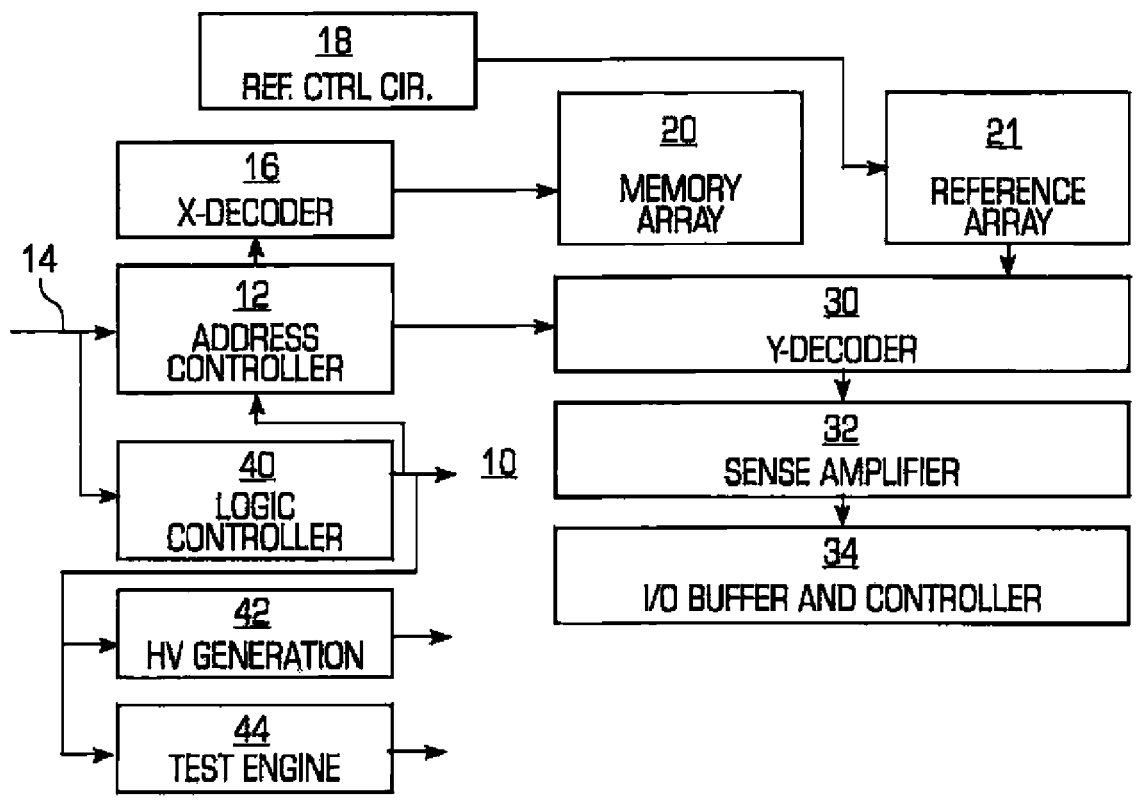
FIG. 1 is a schematic block diagram of a memory device of the prior art showing the relationship of the array of memory cells and the array of reference cells.
Figure 3:
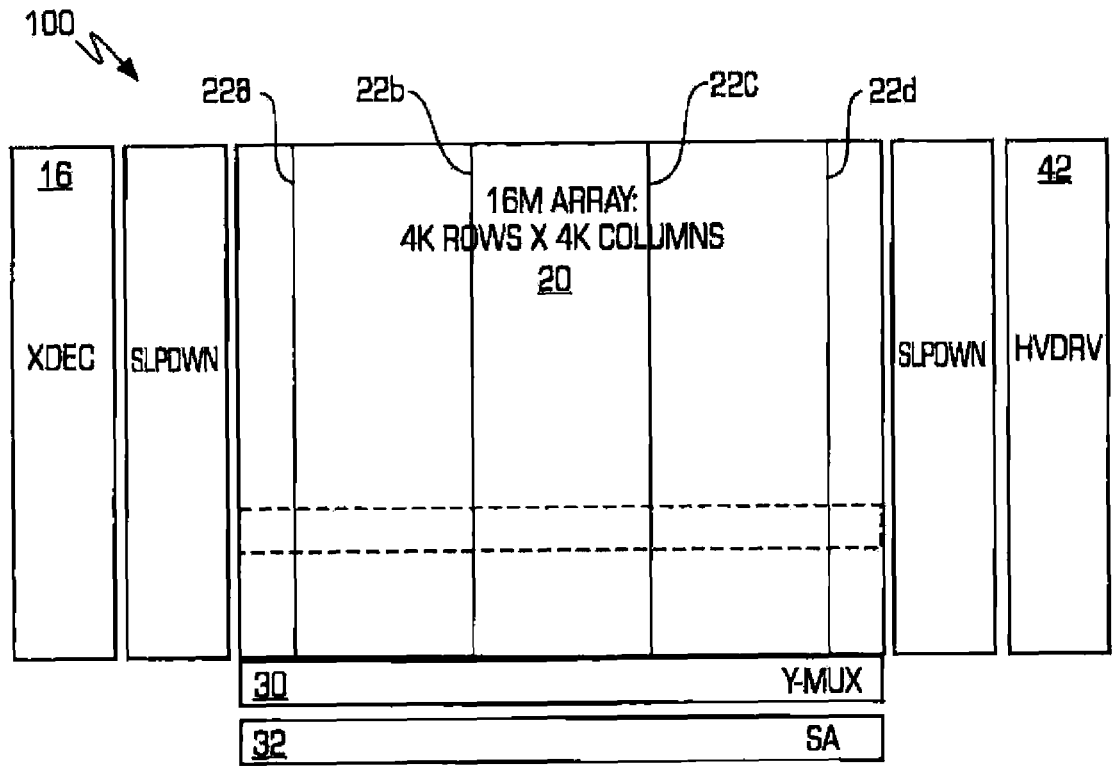
FIG. 3 is a schematic top level view of one embodiment of the layout of an improved memory device of the present invention.

Referring to FIG. 3 there is shown a schematic top view of one embodiment of the memory device 100 of the present invention. In the memory device 100 of the present invention the difference between the memory device 100 and the memory device 10 shown in FIG. 1 is the position and location of the reference memory cells and the strapping of those memory cells. Thus, the memory device 100 also comprises components such as address controller 12, logic controller 40, test engine 44 and I/O buffer and controller 34 which are not shown. The memory device 100 comprises an array 20 of non-volatile memory cells, and in the preferred embodiment, the memory cells are of the type 50 shown and described in FIG. 2. The array 20 of memory cells 50 has a plurality of rows and columns of memory cells 50. The array 20 has a first side which is along the first column of memory cells 50, and a second side which is opposite to the first side. The array 20 also has a third side which is along the first row of memory cells 50 and a fourth side which is opposite the third side. The device 100 further comprises an X decoder 16 which decodes the address signals and supplies them to the row lines which are connected to the array 20. The X decoder 16 supplies decoded low voltage signals on the row lines to which it is connected to the array 20. The X decoder 16 is positioned along the first side of the array 20 and is adjacent to the first column of memory cells 50. In addition, the memory device 100 has a high voltage generator and decoder 42, which is positioned along the second side which is opposite to the first side of the array 20. The high voltage generator and decoder 42 decodes address signals and supplies high voltage decoded address signals to the row lines which are connected to the high voltage generator and decoder 42 and supplies them to the array 20. The Y decoder or Y Mux 30 is positioned along the third side, of the array 20 which is adjacent to the first row of memory cells 50. Finally, a plurality of sense amplifiers 32 is positioned adjacent to the Y decoder 30.

The device 100 also comprises a plurality of columns 22(a-d) of reference memory cells embedded in the array 20. In the preferred embodiment each of the reference memory cells is of the same type as the memory cell of the array 20. Since the reference memory cells is of the same type as the memory cell of the array 20 and since the selected reference memory cells is embedded locally on the same selected row there is no need to add for example dummy cells (dummy columns) next to the reference cells. This is hereinafter referred to as embedded-local-reference. The columns 22(a-d) of reference memory cells 50 are substantially evenly spaced apart. Furthermore, the location of these reference bitlines is spaced apart from the edge of the array and from the metal strap location (metal strapping to poly WL, CG, or EG or diffusion layer SL of memory cells to reduce time delay or voltage drop (to be described in more detail hereinafter), so as to minimize the process variation alone the edge and strap structure is not the same as the memory cell structure and their location is not symmetrical to the memory cell location. Further, because the reference memory cells are of the same type as the memory cells 50 in the array 20, each row of memory cells 50 in the array 20 will have a plurality of reference memory cells that are also even spaced apart from one another. As an example, the array comprises of 4K columns with 4K rows. Thus, in each row there are approximately 4K memory cells 50. In the preferred embodiment, there are 4 columns of reference memory cells, evenly spaced apart from one another. Thus, there is approximately 1 reference cell for every 1K memory cells. Alternatively there can be 2, 4, 8 or more reference cells for every 1K memory cells such as for averaging, the reference cell variation at expense of more reference cells. The reference cells are hereinafter referred to as local reference cells since their locality is local to that of the data memory cells.

In another embodiment hereinafter referred to as N-of-M selective reference scheme, to improve the uniformity of the reference level, for each reference cell used to establish a reference level, e.g. N=four cells is used to average the variations. Furthermore, there is a multitude of reference, e.g. M=8 cells, from which is selected the best or most desirable of the N=4 reference cells, out of the M=8 reference cells. This selection can be automatically done by a test circuitry on-chip or by a production tester in testing. This N-of-M selective reference scheme can be used for other compensating schemes described herein.

Figure 4:
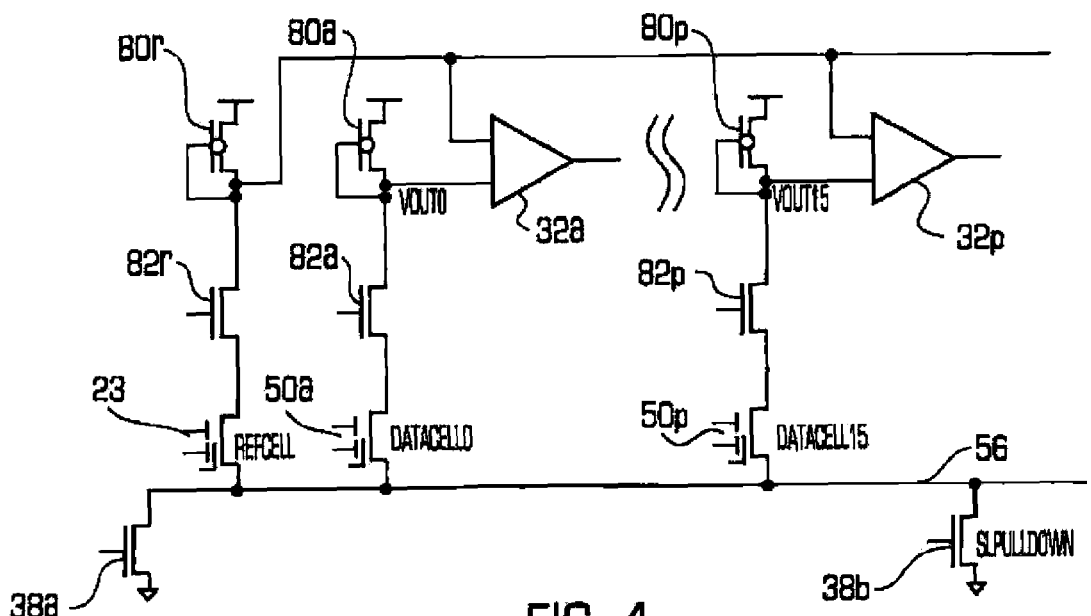
FIG. 4 is a circuit diagram of the sense amplifier portion of the memory device shown in FIG. 3.

The sensing of the selected memory cell 50 is done by the circuit 70 shown in FIG. 4 After the particular row of memory cells 50 is chosen by the selected row line in the array 20, the Y decoder 30 (in FIG. 3, not shown in FIG. 4) selects the bitline of the particular memory cell 50 from that selected row line. The signal from the bit line which is connected to the second region 58 of the selected memory cell is supplied to a first terminal of a select sense amplifier 32 (a-p) (in the example shown in FIG. 4, 16 sense amplifiers 32 are shown) through the Y decoder 30 (not shown in FIG. 4), NMOS transistor 82a-p and pull-up (load) PMOS transistor 80a-p. The signal from the bit line which is connected to the second region 58 of the reference memory cell 22 for that group of selected memory cells 50 is supplied to a second terminal of the select sense amplifier 32 (a-p) through the Y decoder 30 (not shown in FIG. 4), NMOS transistor 82r and pull-up (load) PMOS transistor 80r. The pull-up (load) PMOS transistor 80a-p and 80r convert the selected memory cell current and the reference memory cell 23 current into a corresponding voltages (the signal from the bitline) which feeds to the first and second terminal of the sense amplifier respectively. The transistor 82a-p and 82r can be used as a pass gates or as cascoding (i.e., clamping a certain fixed bias voltage on the selected bitline) transistors for the load transistor 80a-p and 80r respectively. The number of the select sense amplifier 32 (a-p) connected to a bitline of a memory cells is typically 4, 8, or 16. The number can be ranged from 1 to 2K with the higher number incurring the expense of slow speed and more trip point (comparison level) variation for the sense amplifier. As shown in FIG. 4, the bit line from the reference cell 22 is also connected to the second terminals of all of the rest of the sense amplifiers 32 for that group of memory cells 50. The select sense amplifier 32 then compares the two current signals at its first terminal and second terminal and determines the state of the selected memory cell 50.

Figure 5:
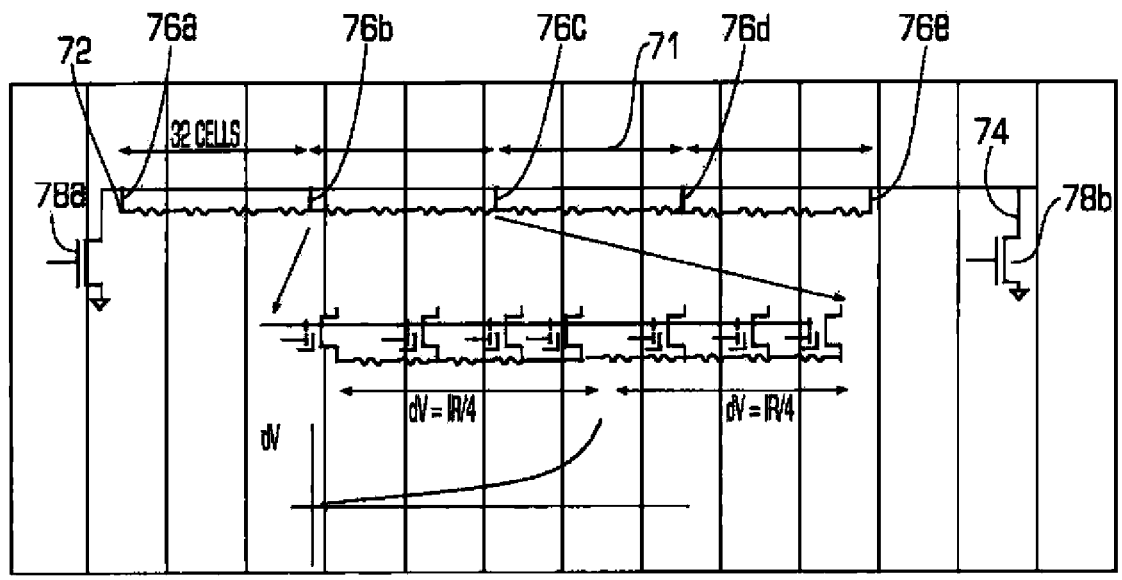
FIG. 5 is a schematic circuit diagram of the strapping for the reference memory cells in the embodiment of the memory device shown in FIG. 3.

One way to improve the performance of the memory device 100 is that because the reference cells 23 are embedded in the array 20, the select reference memory cell 23 which is used for a reference during the sensing operation is located in the same row as the selected memory cell 50. Thus, they would have a common source line or first region 56. As discussed above, during a read operation the first region or the source line must be connected to ground. Since the first region 56 or the source line is a diffusion region in the substrate 52, it can be highly resistive if ground voltage is applied only either at the first side of the array 20 (near the X decoder 16) or near the second side of the array 20 (near the High Voltage driver decoder 42). In order to minimize the resistance, metal strapping of that source line can be used. Referring to FIG. 5 there is shown as metal line 71 (drawn horizontally in the FIG. 5) having a first end 72 and a second end 74. The first end 72 is along the first side of the array 20, while the second end 74 is along the second side of the array 20. Both the first end 72 and the second end 74 are connected to ground voltage through distributed-pull-down transistors 78a and 78b to minimize the voltage drop at the ends of the line 71. As illustrated there are two distributed-pull-down transistors (78a and 78b) for pull down the line 71 to ground, but more than two distributed-pull-down transistors are preferable to minimize further voltage drop. These transistors 78a and 78b are similar to transistors 38a and 38b in FIG. 4. Between the first end 72 and the second end 74, the metal line 71 is connected to the source line 56 by a plurality of vias 76 (a-e). In this manner, the source line connecting the first regions 56 are connected to the low resistance metal line 71.

By embedding locally the reference memory cells 23 in columns and rows in the memory array 20 it enables the following advantages to occur. First during manufacturing, the reference memory cells 23 are subject to the same process deviations as the memory cells 50. In addition, because the reference memory cells 23 are embedded in columns that are substantially even spaced, there is a plurality of reference memory cells 23 for each row of memory cells 50 so as to average out the spatial effect globally across the entire chip dimension. Finally, the current metal strap and distributed-pulldown-transistor discussed heretofore, enables faster response for both reference memory cells 23 and memory cells 50 in the same row. The disadvantage is that the reference cells 23 are also erased as the memory cells 50 are erased. Further, there may be disturbances in programming due to the presence of high voltage lines. These locally embedded reference cells thus require more extensive testing to avoid these adverse effects. Finally, more area overhead may be result.

Figure 6:
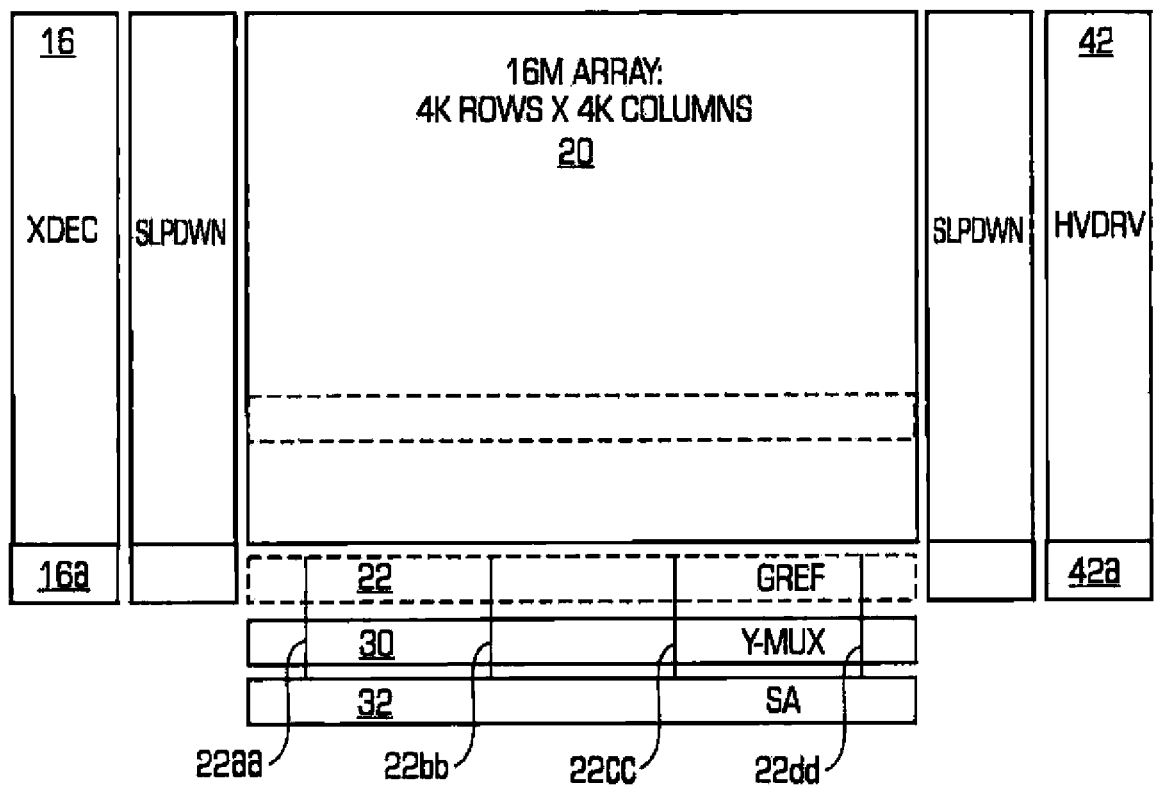
FIG. 6 is a schematic top level view of another embodiment of the layout of an improved memory device of the present invention with internal global reference cells.

Referring to FIG. 6 there is shown a schematic top view of another embodiment of the memory device 200 of the present invention. The memory device 200 is similar to the device 100 shown in FIG. 3, and thus like numbers will be used for like parts. The memory device 200 similar to the memory device 100 also comprises components such as address controller 12, logic controller 40, test engine 44 and I/O buffer and controller 34 which are not shown. The memory device 200 comprises an array 20 of non-volatile memory cells, and in the preferred embodiment, the memory cells are of the type 50 shown and described in FIG. 2. The array 20 of memory cells 50 has a plurality of rows and columns of memory cells 50. The array 20 has a first side which is along the first column of memory cells 50, and a second side which is opposite to the first side. The array 20 also has a third side which is along the first row of memory cells 50 and a fourth side which is opposite the third side. The device 200 further comprises an X decoder 16 which decodes the address signals and supplies them to the row lines which are connected to the array 20. The X decoder 16 supplies decoded low voltage signals on the row lines to which it is connected to the array 20. The X decoder 16 is positioned along the first side of the array 20 and is adjacent to the first column of memory cells 50. In addition, the memory device 200 has a high voltage generator and decoder 42, which is positioned along the second side which is opposite to the first side of the array 20. The high voltage generator and decoder 42 decodes address signals and supplies high voltage decoded address signals to the row lines which are connected tot eh high voltage generator and decoder 42 and supplies them to the array 20.

The memory device 200 further comprises an array 22 of reference memory cells positioned contiguously adjoining (or alternatively less than a few micron apart) to the array 20 of memory cells, with the array 22 of reference cells positioned along the third side of the array 20. The array 22 of reference cells, similar to the array 20, is substantially rectilinearly shaped and also has a first side which is co-linear with the first side of the array 20, and a second side, which is co-linear with the second side of the array 20. The reference array 22 also comprises a plurality of columns 22(*aa-dd*) of reference memory cells embedded in the array 22. The column 22*aa* for example may include multiple columns of reference memory cells. Since the reference array 22 is adjoined to the main array 20 but physically and electrically isolated from it (not embedded in the main array 20 locally as in the embedded-local-reference described above), it is hereinafter referred to as internal-global-reference (global since the reference cells 23 are shared across many rows or all rows in the array 20, internal since it is adjoining the main array). Since the reference cells 23 are isolated from the main array 20, dummy cells (dummy rows and columns) are needed to either electrically isolate the reference cells (reference column and row) and/or avoiding the process effect (such as optical proximity correction or OPC or chemical mechanical polishing CMP. Odd/even reference row is used for odd/even data memory cells respectively for the purpose of tracking the same physical and electrical effect between reference and data cells (this can also be used for external global reference or micro reference array described below). An X decoder 16*a*, which is similar to X Decoder 16, is also positioned adjacent to the first side of the array 22 and supplies decoded low voltage signals on row lines which are connected to the array 22. Similarly, a high voltage generator and decoder 42*a*, which is similar to the high voltage generator and decoder 42, is also positioned along the second side of the array 22 and is opposite the first side of the array 22. The high voltage generator and decoder 42*a* supplies decoded high voltage signals on row lines which are connected to the array 22.

The memory device 200 also comprises a Y decoder or Y Mux 30, which is positioned along the third side, of the array 22 of reference cells. Thus, the array 22 of reference cells is between the array 20 and the Y decoder 30. Finally, a plurality of sense amplifiers 32 is positioned adjacent to the Y decoder 30, and receive the signals from the bit lines from the memory cells 20 as well as from the reference memory cells 22.

Figure 7A:
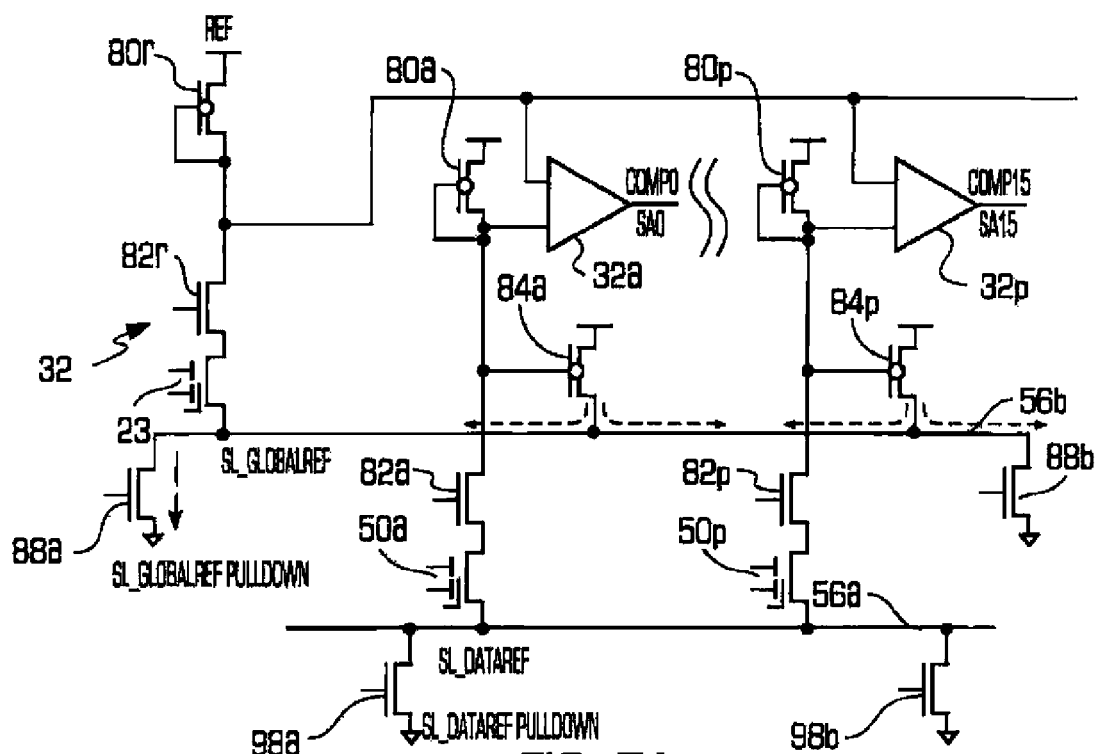
FIG. 7A is a circuit diagram of the sense amplifier portion of the memory device shown in FIG. 6.

Referring to FIG. 7A there is shown a circuit diagram of an array of sense amplifiers 32. Similarly to that of FIG. 4, the Y decoder 30 and its function shown in FIG. 3 is not shown in FIG. 7. The sense amplifier array 32 comprises a plurality of sense amplifiers, e.g. 32*a*. The sense amplifier 32*a* receives as one of its input, the signal from the reference memory cell 23. The reference cell current in reference memory cell 23 is converted into a corresponding voltage (the signal from the reference memory cell 23) by the load PMOS transistor 80*r*. All of the reference memory cells 23 in the same row are connected by the source diffusion region 56*b*. The sense amplifier 32*a* also receives as one of its inputs, the signal from a selected memory cell 50*a*. The cell currents in selected memory cell 50*a-p* is converted into a corresponding voltages (the signal from the selected memory cells) by the load PMOS transistors 80*a-p*. All of the memory cells 50*a-p* in the same row share a common source region 56*a*. During the sensing of the selected memory cell, e.g. 50*a*, both the source line 56*a* and source line 56*b*, are pulled to ground by distributed-pulldown-transistors 88*a*, 88*b* for the selected reference cells and distributed-pulldown-transistors transistors 98*a*, 98*b* for the selected memory cells. These transistors function similarly to transistors 78*a*, 78*b* in FIG. 5. The cell current of the selected memory cells 50*a-p* flows through the source line 56*a* to the pulldown transistor 98*a*, 98*b* to the ground. The cell current of the selected memory cells 50*a-p* together with resistance of the source line 56*a* will cause a voltage drop across the source line 56*a*. The cell current of the selected memory cells 50*a-p* also cause another voltage drop across the transistors 98*a*, 98*b*). This is particularly undesirable when a lot of memory cells are selected for reading such as in a page mode read. In the meantime the source line 56*b* and the pulldown transistor 88*a*, 88*b* experiences the voltage drop from the reference cells 23. Since the number of the reference cell 23 is different from the number of the selected memory cells 50*a-p* the voltage drop is not the same causing variation between the signal from the reference cell and the selected memory cells, which in turns causing the sense amplifier 32*a-p* to compare (trip) differently. This voltage difference varies further over PVT (process, power supply, and temperature) effect. Furthermore the cell current of the selected memory cells 50*a-p* depends on the non-volatile state (program or erase state) of the memory cells as described in FIG. 2 (erase and program state meaning high and low cell current respectively). Thus it is desirable to minimize this data dependent ('1' high cell current or '0' low cell current logical data) effect. In the memory device of the present invention, this is achieved by using a replica-data-pattern-current scheme. The scheme works as follows: the selected memory cell currents are replicated and forced into the source line of the reference cells to replicate the voltage drop on the source-line of the selected memory cells onto the source-line of the reference cells. Transistors 80*a-p* are used to achieve this by mirroring the cell currents of the selected memory cells 50*a-p* respectively and then dump this current into the source line 56*b*. For example if the selected cell currents are zero then there is no current forced into the source line 56*b*. Other means, other than current mirroring to achieve the replica current is possible using circuitry such as operational amplifier based servo control circuits.

Figure 7B:
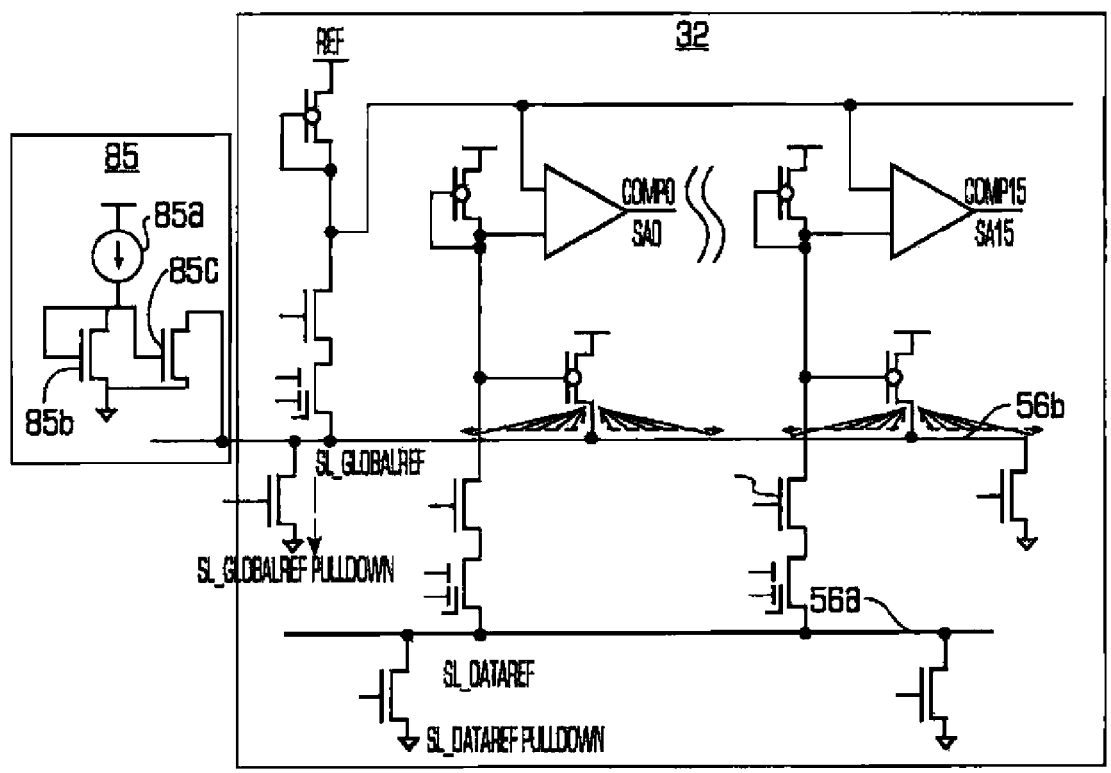
FIG. 7B is a circuit diagram of another embodiment of the sense amplifier portion of the memory device shown in FIG. 6.

Referring to FIG. 7B there is shown a circuit diagram of an array of sense amplifiers 32 and a reference current compensator 85. The reference current compensator consists of a bias current 85*a* replicating the reference memory cell current and through a NMOS current mirror 85*b*, 85*c* injecting an appropriate amount of current to compensating for the reference current flowing into the source line 56*b*.

Figure 8:
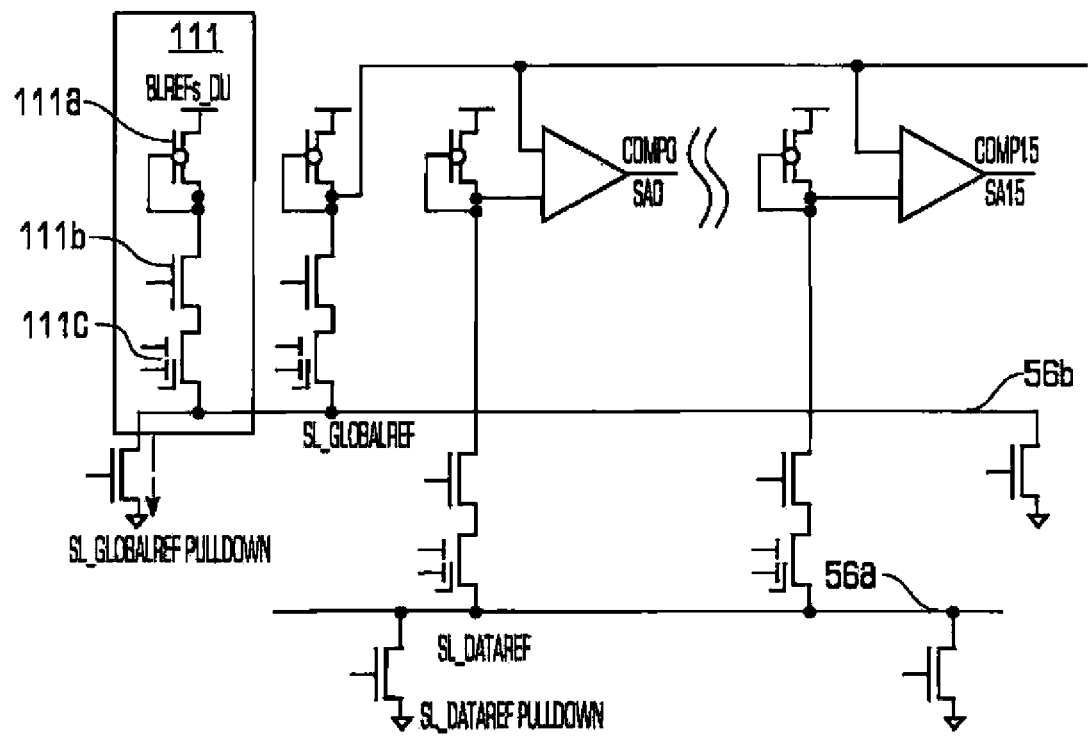
FIG. 8 is a circuit diagram of another embodiment of the sense amplifier portion of the memory device shown in FIG. 6.

Referring to FIG. 8 there is shown a circuit diagram of an array of sense amplifiers similar to that of the array of sense amplifiers 32 but instead of replica-data-pattern-current scheme it uses a pre-determined data current compensator 111. The data current compensator 111 consists of a PMOS transistor 111a, NMOS transistor 111b, a memory cell 111c similarly to the transistor 80a, 82a, and memory cell 50a respectively. The data current compensator 111 is used to inject a pre-determined number, e.g. 2, 4, 6, 1.5, of memory cell currents into the source line 56b of the reference cell to partially compensate the voltage drop difference between that of the source line 56b of the reference memory cell and the source line 56a of the selected (data) memory cell. The physical layout structure of data current compensator 111 is the same as that of the selected memory cell (the transistor 80a, 82a, and memory cell 50a).

Figure 9:
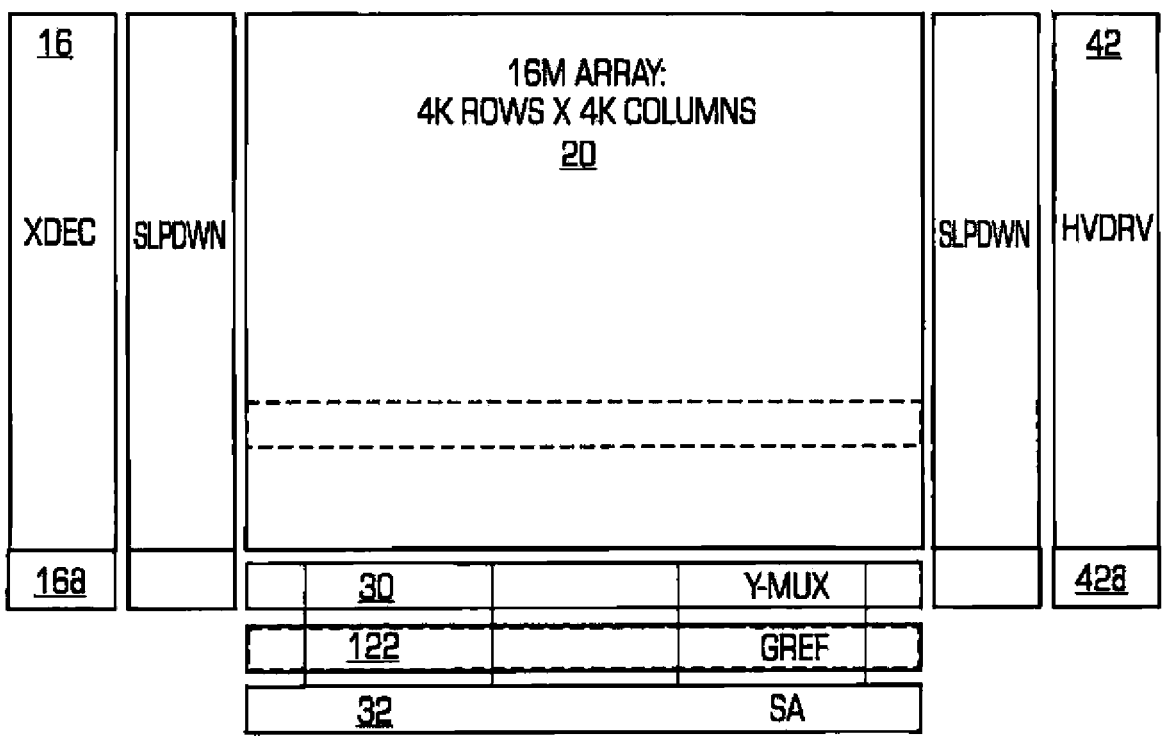
FIG. 9 is a schematic top level view of another embodiment of the layout of an improved memory device of the present invention with external global reference cells.

Referring to FIG. 9, there is shown a schematic top view of yet another embodiment of the memory device 300 of the present invention. The memory device 300 is similar to the device 200 shown in FIG. 6, and thus like numbers will be used for like parts. The memory device 300, similar to the memory device 200, also comprises components such as address controller 12, logic controller 40, test engine 44 and I/O buffer and controller 34 which are not shown. The memory device 300 comprises an array 20 of non-volatile memory cells, and in the preferred embodiment, the memory cells are of the type 50 shown and described in FIG. 2. The array 20 of memory cells 50 has a plurality of rows and columns of memory cells 50. The array 20 has a first side which is along the first column of memory cells 50, and a second side which is opposite to the first side. The array 20 also has a third side which is along the first row of memory cells 50 and a fourth side which is opposite the third side. The device 300 further comprises an X decoder 16 which decodes the address signals and supplies them to the row lines which are connected to the array 20. The X decoder 16 supplies decoded low voltage signals on the row lines to which it is connected to the array 20. The X decoder 16 is positioned along the first side of the array 20 and is adjacent to the first column of memory cells 50. In addition, the memory device 300 has a high voltage generator and decoder 42, which is positioned along the second side which is opposite to the first side of the array 20. The high voltage generator and decoder 42 decodes address signals and supplies high voltage decoded address signals to the row lines which are connected tot eh high voltage, generator and decoder 42 and supplies them to the array 20.

The memory device 300 further comprises a Y decoder or Y Mux 30, which is positioned adjacent to the array 20 of memory cells, with the Y decoder or Y Mux positioned along the third side of the array 20. The memory device 300 also comprises an array 122 of reference memory cells 23 positioned adjacent to the Y decoder or Y Mux 30 but spaced apart therefrom. The reference array 122 may be similar to some aspect as that of the reference array 22 in FIG. 6 such as same basic physical reference cell construction but different in the edged cells (dummy row and dummy column structure to avoid process effect) since the reference array 122 is substantially further apart from the main array 20 than the reference array 22 (such as by more than tens of microns). This embodiment shown in FIG. 9 is referred to as an external-global-reference scheme compared to the internal-global-reference scheme of FIG. 6. Finally, the memory device 300 comprises an array of sense amplifiers 32 positioned adjacent to the array 122 of reference memory cells. Except for the interchange of the position of the Y decoder or Y Mux 30 with the array 122 of reference memory cells, the memory device 300 is in all aspects similar to the memory device 200 shown and described in FIG. 6. Similar to the embodiment shown in FIG. 6, The X decoder 16a is also positioned adjacent to the first side of the array 122 and supplies decoded low voltage signals on row lines which are connected to the array 122. Similarly, the high voltage generator and decoder 42a is also positioned along the second side of the array 122 and is opposite the first side of the array 122. The high voltage generator and decoder 42a supplies decoded high voltage signals on row lines which are connected to the array 122.

The advantage of the embodiment of the memory device 300 shown in FIG. 9 is that since the reference may 122 is isolated from the array 20, it is easier to organize the reference array 122 different from the main array 20 such as different number of bitlines and different number of rows. Furthermore various compensation schemes can be applied more easily, such as by allowing compensation circuitry easier physical interface to the external reference array.

Alternative embodiment of the reference array 122 is using a WAT-like structure (Wafer Acceptance Test structure) which is readily available and is used to test for electrical parameter to accept the wafers produced from fabrication house. This reference array is very small and hence is called a micro-reference-array, typically including from 8-128 rows and 8-129 columns of cells with most of the rows and columns acting as dummy cells to avoid process effects.

Method of operation for unused terminals of the global reference array 22 or 122 is as follows. The unused bitlines can be left floating or inhibited by a bias voltage during programming, and by a floating or aground level during read, by floating or grounded during erase. The unused wordline (select gate) can be grounded. The unused control gate (top gate) can be grounded or floating. The unused source line or erase gate can be floating or grounded.

To minimize the difference between a reference cell especially for global or micro reference and a data memory cell says due to proximity or CMP effect (chemical mechanical polishing) during the processing steps to manufacture the memory device of the present invention, due to large spatial difference, a reference cell can be set to a desired level using an incremental erase algorithm, in which the erase voltage level is applied successively from a low to a high level and successively verified against a target. Similarly to set a reference cell to a desired level, an incremental programming algorithm can be used in which the programming voltage level, e.g., CG level or SL level, is applied successively goes from a low to a high level and successively verified against a target.

An embodiment to set the reference cell level of the global or micro reference cell to a desired level (so as to minimize the difference between reference cells and data cells) is applying different bias level in read (e.g. BL/WL/CG/EG) for reference cells. This also can be used for margin testing (testing cells meeting a certain level) to guarantee field lifetime usage.

Figure 10:
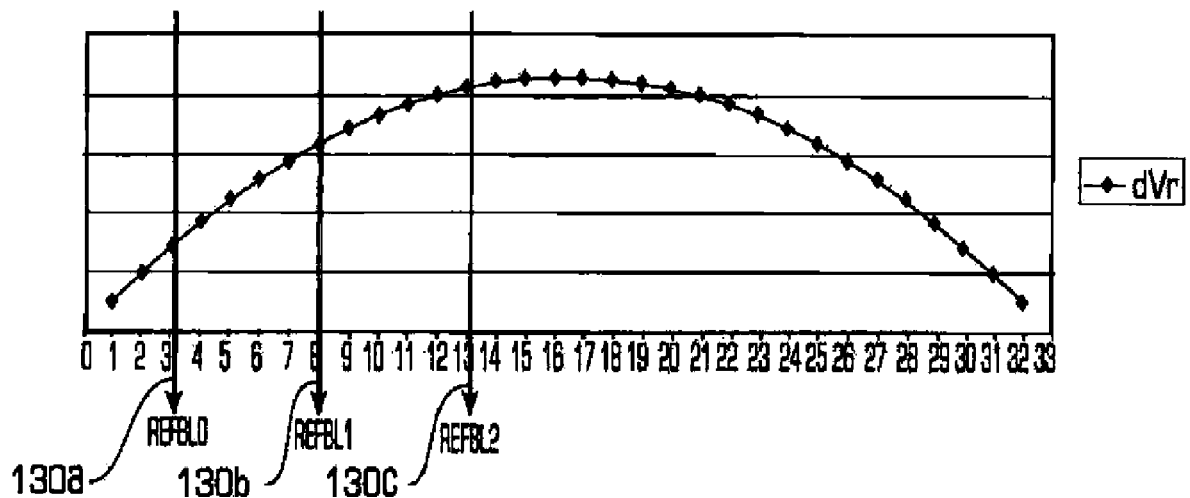
FIG. 10 is a diagram showing source line diffusion compensation in the memory device of the present invention.

As described above the source region 56 of the memory cell is made of diffusion layer which is highly resistive. For example the way 20 is made of 4K bitlines (4K cells horizontally) if the source line 56a, 56b is made of diffusion layer across all 4K bitlines its resistance would be high, e.g., hundreds of thousand ohms. Hence a metal layer is used to strap through via layer to diffusion to reduce resistance of long distance. The strapping frequency is for example per 8, 16, 32, or 64 cells. FIG. 10 shows a strap segment of 32 cells and the voltage drop (vertical axis) along the 32 bits when there is a current flowing. As shown there are three reference bitlines used, 130a, 130b, and 130c within this 32 cells strap. The reference bitline 130a, 130b, or 130c is selected when data bitline (columns) group of (0-5, 25-31), (6-10, 25-21), (11-15, 20-16) is selected respectively. This minimize the voltage drop between the selected data cell and the selected reference cells to <=⅙ of +/−voltage drop across diffusion within 32-strap. Also the location of these three reference bitlines is spaced apart from the strap location so as to minimize the process variation since the strap structure is not symmetrical to real memory cell structure. Another scheme is to use a dummy or unused cell next to each strap to minimize the process variation effect from the strap on the actual memory cells. Other arrangement, for example +/−¼ voltage drop (2 reference bitline per 32 strap) is possible.

Figure 11:
FIG. 11 is a diagram showing another source line diffusion compensation in the memory device of the present invention.
Figure 11:
Figure 11:
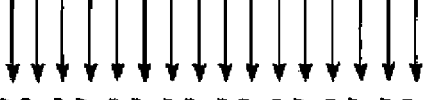

FIG. 11 shows an embodiment to improve the diffusion voltage drop variation per source line strap by using 16 reference cells. In this case, one reference cell is used for two symmetrical data cells. For example reference bitline 0 is used for data bitline 0 and 31. The selection of what reference bitline corresponding to what data bitline is done by the binary Y decoding circuitry (binary decoding 32:1).

Figure 12:
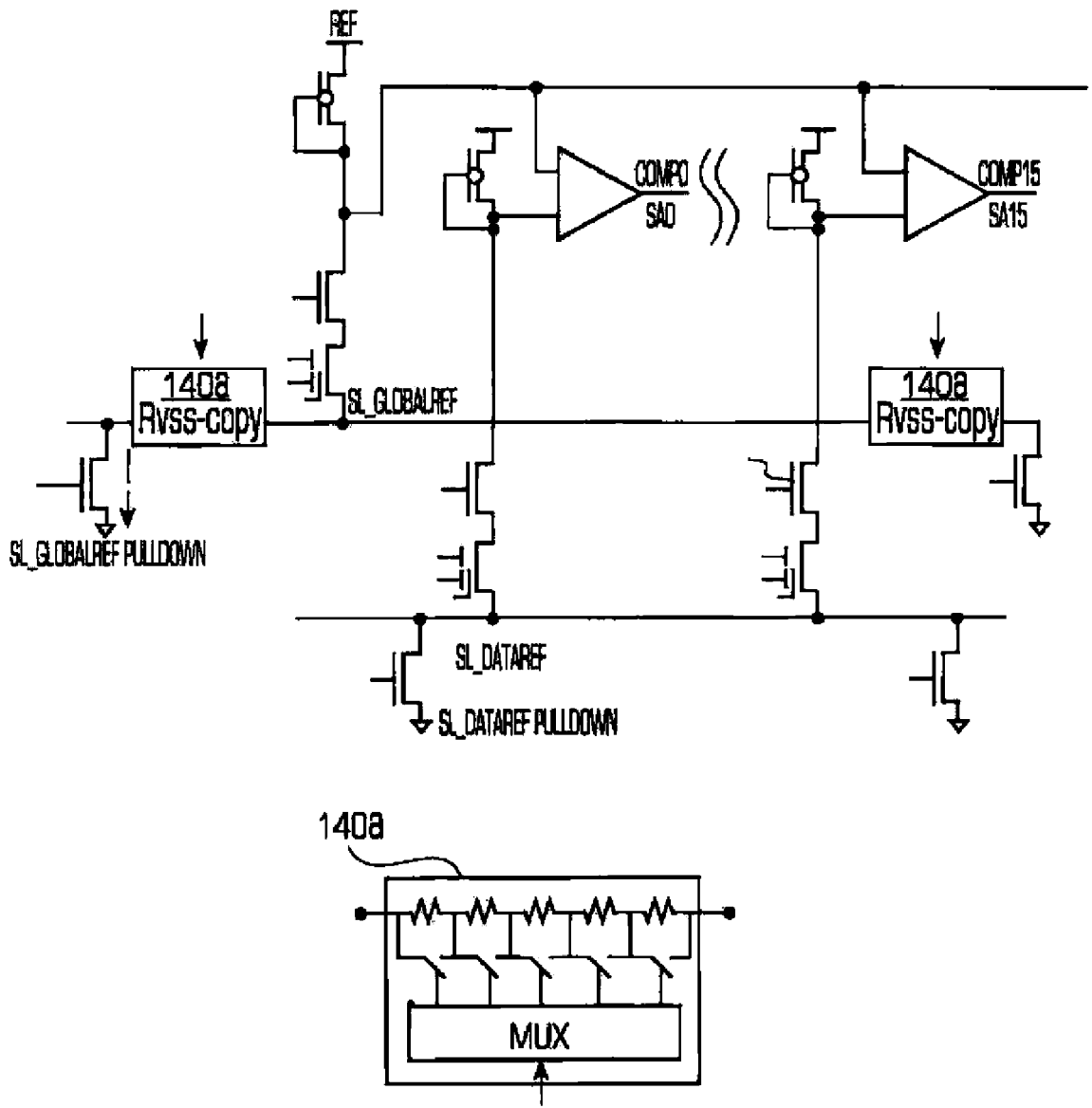
FIG. 12 is a diagram showing source line diffusion compensation using resistance replica in the memory device of the present invention.

FIG. 12 shows an array of sense amplifier 32 without replica-data-pattern-current compensation and with source line diffusion compensation. Resistor 140a is used to replicate, preferably same physical layout structure as source region 56, the source line resistance per strap. It compensates by appropriately turning on certain resistance to mirror the diffusion resistance of the source line in the data memory cells. For example if bitline5 within 32-cells strap of data memory cell is selected, the resistance of the resistor 140a should be turned on to substantially equal to that of the bitline5.

Figure 13:
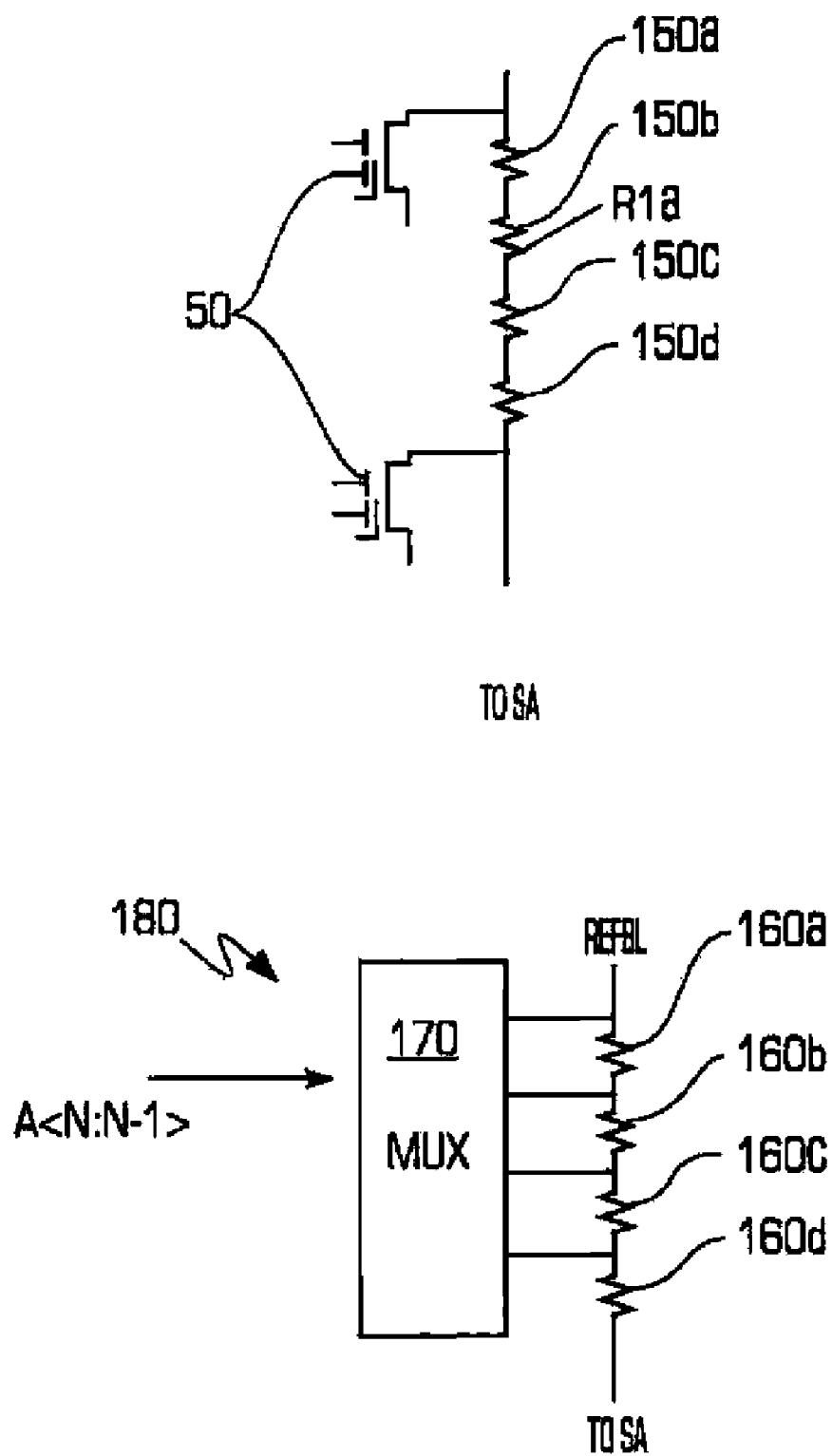
FIG. 13 is a diagram showing bitline voltage error compensation in the memory device of the present invention.

Due to the internal or external global reference array being outside of the array 20, there is a voltage drop along bitline of the selected data memory cell due to cell current flowing. This causes variation for cell at top row versus bottom row of the array 20, for example. To compensate, a bitline-voltage-error compensation scheme is used as follows. A bitline-4-quadrant-tracking is used as an illustration as shown in FIG. 13. As shown there are equivalent four resistors along the bitline connecting to memory cells 50 from top to bottom of the array 20. Diffusion resistance compensator 180 consists of a mux 170 and four resistance 160a, 160b, 160c, and 160d. These four are substantially equal to the resistors 150a, 150b, 150c, 150d. For example when a memory cell at the top of array is selected the mux 170 will turn on all four resistor 160a-c to replicate the resistors 150a-d. Similarly for example of the memory cell at the bottom the array 20 is selected the mux 170 will bypass all four transistors 160a-d.

Alternatively a reference-off-current scheme can used to compensate for the bitline resistance across the array (or for the diffusion resistance within the source line strap). For example four offset values can be stored in a table (such as a look up table) to replicate the effect of the four equivalent resistor 150a-d (more resistance less current) as above by appropriately subtracting a pre-determined amount (for example from characterization) of current from the reference current before being coupled to the sense amplifier.

Finally, various combinations of the compensation scheme described above can be used together or any combination thereof with the embedded local reference, the internal global reference, the external reference and the micro-reference-array to improve performance.

What is claimed is:

1. A non-volatile memory device comprising:
an array of non-volatile memory cells arranged in a plurality of rows and columns, with each memory cell having a first region of a first conductivity type in a substrate of a second conductivity type, a second region of the first conductivity type spaced apart from the first region forming a channel region therebetween, a floating gate positioned over a portion of the channel region and insulated therefrom and adjacent to the first region, a control gate positioned over another portion of the channel region, and insulated therefrom, and adjacent to the floating gate and insulated therefrom, a top gate positioned over the floating gate, insulated therefrom, and an erase gate positioned over the first region, insulated therefrom, and adjacent to the floating gate; a bit terminal for connection to a bit line, wherein the bit terminal is said second region, and a source terminal for connection to a source line, wherein the source terminal is the first region;
said array having a first side adjacent to a first column of memory cells, and a second side opposite the first side, a third side adjacent to a first row of memory cells, and a fourth side opposite the third side;
a plurality of columns of reference memory cells embedded in said memory array, with a plurality of reference cells in each row of said array of non-volatile memory cells, substantially evenly spaced apart from one another; each of said reference memory cells, substantially the same as the non-volatile memory cells;
a plurality of sense amplifiers positioned on said third side, with each sense amplifier connected to the bit terminal of one column of non-volatile memory cells and to the bit terminal of a column of reference memory cells; and
resistance circuitry replicating the resistance of the source line containing the selected memory cells;
wherein the control gate and the top gate are connected to low voltage terminals, and the erase gate and top gate and the first region are connected to high voltage terminals.

2. The memory device of claim 1 wherein each sense amplifier is connected to the bit terminal of one column of a plurality of columns of memory cells and to the bit terminal of a column of reference memory cells.

3. The memory device of claim 1 further comprising a metal line for strapping to the first region of each of the memory cells and the reference cells in the same row.

4. The memory device of claim 1 further comprising a source line connected to the first region of the memory cells in the same row, with a plurality of pull down transistors connected to the source line.

5. The memory device of claim 1 wherein each memory cell is programmed incrementally until a threshold is reached.

6. The memory device of claim 1 wherein each memory cell is erased incrementally until a threshold is reached.

7. The memory device of claim 1 wherein each of the reference memory cells is located spaced apart from the first side, second side, third side and fourth side.

8. The memory device of claim 3 wherein each of the reference memory cells is located spaced apart from metal line for strapping to the first region.

9. The memory device of claim 1 further comprising circuitry for choosing selected reference memory cells from a column of memory cells for connection to the plurality of sense amplifiers.

* * * * *